(12) United States Patent
Koay et al.

(10) Patent No.: US 11,424,226 B2
(45) Date of Patent: Aug. 23, 2022

(54) LIGHT-EMITTING DEVICE AND METHOD FOR PRODUCING A PLURALITY OF LIGHT-EMITTING DEVICES

(71) Applicant: OSRAM Opto Semiconductors GmbH, Regensburg (DE)

(72) Inventors: Seong Tak Koay, Georgetown (MY); Adelene Geok Ling Ng, Bayan Lepas (MY); Chui Wai Chong, Prai (MY); Teng Hai Chuah, Bukit Mertajam (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 154 days.

(21) Appl. No.: 16/969,156

(22) PCT Filed: Mar. 5, 2018

(86) PCT No.: PCT/EP2018/055281
§ 371 (c)(1),
(2) Date: Aug. 11, 2020

(87) PCT Pub. No.: WO2019/170214
PCT Pub. Date: Sep. 12, 2019

(65) Prior Publication Data
US 2021/0043609 A1    Feb. 11, 2021

(51) Int. Cl.
*H01L 25/075*    (2006.01)
*H01L 33/00*    (2010.01)
(Continued)

(52) U.S. Cl.
CPC ...... *H01L 25/0753* (2013.01); *H01L 33/0095* (2013.01); *H01L 33/54* (2013.01);
(Continued)

(58) Field of Classification Search
CPC ............. H01L 33/60; H01L 25/0753; H01L 2933/0058
See application file for complete search history.

(56) References Cited

U.S. PATENT DOCUMENTS 9,324,697 B1 * 4/2016 Lin ................. H01L 25/167
2011/0024773 A1   2/2011 Lu et al.
2016/0099383 A1   4/2016 Yuh

FOREIGN PATENT DOCUMENTS

DE    102008019902 A1    6/2009
EP      2360750 A1    8/2011
(Continued)

*Primary Examiner* — Marcos D. Pizarro
*Assistant Examiner* — Antonio B Grite
(74) *Attorney, Agent, or Firm* — ArentFox Schiff LLP

(57) ABSTRACT

The invention relates to a light emitting device comprising: a support, at least two light-emitting elements at a top side of the support, first connection locations and a single second connection location at a bottom side of the support, wherein each light-emitting element comprises a first contact location and a second contact location at a side facing away from the support, each first contact location is connected to one of the first connection locations via a first connection, all of the second contact locations are connected to the second connection location via a second connection, the first connections run along an outer surface of the support, and the second connection runs through the support.

13 Claims, 4 Drawing Sheets

Figure 1A:
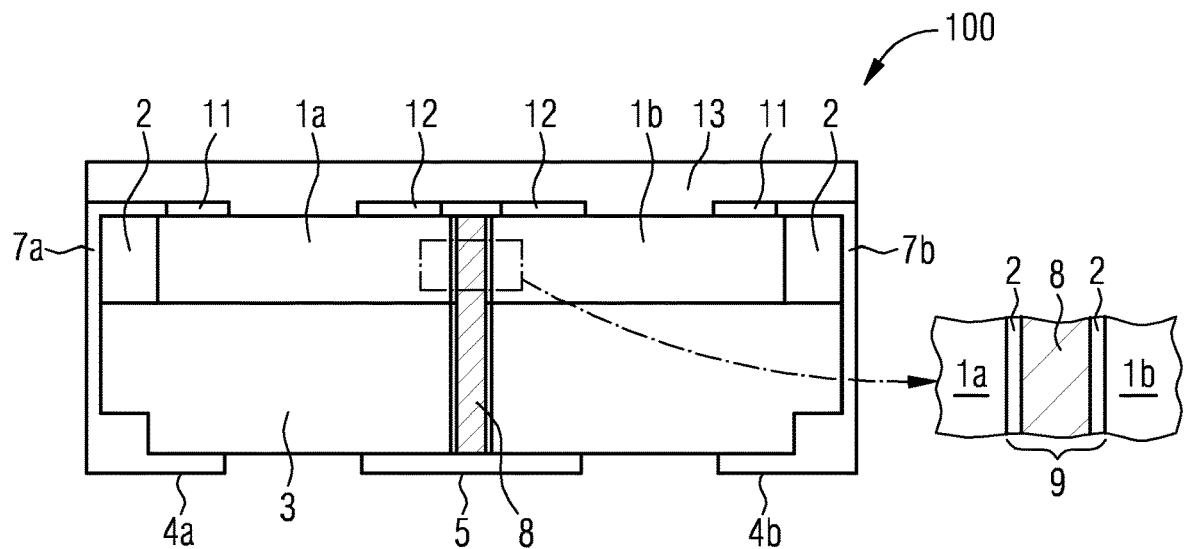

(51) Int. Cl.
*H01L 33/54* (2010.01)
*H01L 33/60* (2010.01)
*H01L 33/62* (2010.01)
*H01L 33/48* (2010.01)

(52) U.S. Cl.
CPC .............. *H01L 33/60* (2013.01); *H01L 33/62* (2013.01); *H01L 2933/005* (2013.01); *H01L 2933/0058* (2013.01); *H01L 2933/0066* (2013.01)

(56) References Cited

FOREIGN PATENT DOCUMENTS

| | | |
|---|---|---|
| EP | 2827388 A1 | 1/2015 |
| WO | 2011026768 A1 | 3/2011 |

\* cited by examiner

LIGHT-EMITTING DEVICE AND METHOD FOR PRODUCING A PLURALITY OF LIGHT-EMITTING DEVICES

This application is a 35 U.S.C.§ 371 National Phase of PCT Application No. PCT/EP2018/055281, filed Mar. 5, 2018, the disclosures of which are hereby incorporated by reference herein.

A light-emitting device and a method for producing a plurality of light-emitting devices are specified.

Document WO 2011/026768 A1 describes a light-emitting device and a method for its production.

One problem to be solved is to specify a light-emitting device which has an enhanced reliability performance. A further problem to be solved is to specify a method for producing such a device.

A light-emitting device is specified. For example, the light-emitting device is a light-emitting diode or a laser diode. During operation the light-emitting device emits light in the spectral range between ultraviolet radiation and infrared radiation. For example, the light-emitting device is able to emit white and/or colored light.

According to one aspect of the light-emitting device, the light-emitting device comprises a support. The support is the element of the light-emitting device which ensures the mechanical stability of the light-emitting device.

For example, the support is a carrier which mechanically supports further elements of the light-emitting device. The support can, for example, comprise an electrically insulating material or consist of an electrically insulating material. Onto and/or into the support further elements like, for example, electrical connection locations and/or electrical connections can be applied.

According to one aspect, the light-emitting device comprises at least two light-emitting elements at a top side of the support. The light-emitting elements are, for example, light-emitting semiconductor diode chips or light-emitting laser diode chips.

For example, the at least two light-emitting elements are configured to emit light of different colors and/or color temperatures during operation. For example, one of the light-emitting elements can be configured to emit red light, another light-emitting element can be configured to emit blue light and a further light-emitting element can be configured to emit green light. In addition, or alternatively, it is possible that at least one of the light-emitting elements is configured to emit white light like, for example, warm white light, cold white light or neutral white light.

The light-emitting elements of the light-emitting device are mechanically connected to the support. For example, the light-emitting elements are connected to the support via an adhesive or via a solder material.

According to one aspect of the light-emitting device, the light-emitting device comprises first connection locations and a single second connection location at a bottom side of the support. That is to say, at the side of the support which faces away from the light-emitting elements at least two first connection locations and a single second connection location are arranged. The connection locations are, for example, formed with an electrically conductive material, in particular a metal or a mixture of metals. For example, the connection locations are configured to be electrically contactable via soldering and/or an adhesive glue and/or a plug connection. The connection locations are mechanically connected to the support and electrically connected to at least one further element of the light-emitting device.

In particular the light-emitting device comprises a number of first connection locations which is the same as the number of light-emitting elements of the light-emitting device. For example, the first connection locations form individual anodes of the light-emitting device, and the single second connection location forms a common cathode of the light-emitting device, or vice versa.

According to one aspect of the light-emitting device, each light-emitting element comprises a first connection location and a second connection location at a side facing away from the support. That is to say, the contact locations of the light-emitting elements are arranged at the top surface of the light-emitting elements which faces away from the support. The first and the second connection locations are, for example, configured for contacting a p-side and an n-side of the light-emitting element, respectively. Further, it is possible that the first connection location and the second connection location are configured to contact an n-side and a p-side of the light-emitting element, respectively.

According to one aspect of the light-emitting device, each first contact location is connected to one of the first connection locations via a first connection. For example, the first connection is an electrically conductive layer which is applied to one or more components of the light-emitting device.

According to one aspect of the light-emitting device, all of the second contact locations are connected to the second connection location via a second connection. The second connection is, for example, formed with an electrically conductive material and is electrically connected to all second contact locations of the light-emitting elements of the device.

According to one aspect of the light-emitting device, the first connections run along an outer surface of the support. For example, the first connections are layers formed with electrically conductive material which are applied to an outer surface of the support and therefore run along the outer surface of the support. For example, the first connections are metallizations or metal layers which are applied to an outer surface of the support and which connect the first contact location of each light-emitting element with an assigned first connection location at the bottom side of the support.

For example, the first connections show traces of a separation method like, for example, sawing at their outer surface which faces away from the support.

According to one aspect of the light-emitting device, the second connection runs through the support. For example, the support comprises a recess into which an electrically conductive material, which forms at least part of the second connection, is applied. The second connection electrically connects the second contact locations of all chips with the single second connection location.

According to one aspect of the light-emitting device, the light-emitting device comprises
a support,
at least two light-emitting elements at a top side of the support,
first connection locations and a single second connection location at a bottom side of the support, wherein
each light-emitting element comprises a first contact location and a second contact location at a side facing away from the support,
each first contact location is connected to one of the first connection locations via a first connection,
all of the second contact locations are connected to the second connection location via a second connection, the first connections run along an outer surface of the support, and the second connection runs through the support.

In light-emitting devices like, for example, light-emitting diode packages wire interconnects are commonly used for electrically connecting the light-emitting elements, for example the light-emitting diode chips, of the device. These wire interconnects limit the possibility to make the package smaller as spacing is required for bond pads, wiring-stress-free distance, bond-pad-to-bond-pad distance, etc.

The present light-emitting device now inter alia rests on the idea that the light-emitting elements of the device can be connected to connection locations of the device via first and second connections instead of wire interconnects like, for example, bonding wires. This allows for a device with a very low height and a small footprint. Further, the present device has a very high reliability performance since there is no mechanical stress on bonding wires.

According to one aspect of the light-emitting device, the light-emitting elements are partly enclosed by an encapsulation and the first connections run along an outer surface of the encapsulation. For example, the encapsulation is formed with an electrically insulating material like silicone or epoxy resin. The encapsulation covers side surfaces of the light-emitting elements at least in locations. For example, the side surfaces of the light-emitting elements are completely covered by the encapsulation and the encapsulation is flush with a side of the light-emitting elements facing away from the support. Further, it is possible that the light-emitting elements protrude over the side of the encapsulation facing away from the support. Thereby the encapsulation can be in direct contact with the support and the light-emitting elements.

The first connections are, for example, layers of electrically conductive material which are applied to a surface of the encapsulation facing away from the carrier and a side surface of the encapsulation which is flush with a side surface of the carrier. For example, the first connections run from the first contact location of the assigned light-emitting element over the encapsulation to an outer surface of the support and from the outer surface of the support, which is for example a side surface of the support, to the first connection locations at the bottom side of the support. In this way the first connections can be applied as electrically conductive layers.

According to one aspect of the light-emitting device, the second connection runs through the encapsulation. For example, a recess is formed in the encapsulation which abuts a recess in the support, and the second connection runs through the encapsulation and the support from the second contact locations of the light-emitting elements to the second connection location. In this way the second connection electrically connects all light-emitting elements to the common second connection location.

According to one aspect of the light-emitting device, the second connection and the encapsulation form a via contact. That is to say, the encapsulation electrically insulates the second connection from surrounding components of the light-emitting device and thus a via contact or a through-hole contact is formed. In this way it is possible that the encapsulation electrically insulates the second connection from side surfaces of abutting light-emitting elements. Thus, the clearance between the light-emitting elements can be used for the arrangement of the second connection between the light-emitting elements. In this way the light-emitting device has a built-in circuit using the element-to-element clearance between the light-emitting elements and the sidewalls of the device.

According to one aspect of the light-emitting device, parts of the second connection are arranged between adjacent light-emitting elements. For example, between each light-emitting element and its directly neighboring light-emitting elements, parts of the second connection are arranged. This allows inter alia for a particularly small pitch distance between neighboring light-emitting elements and thus for a higher resolution.

According to one aspect of the light-emitting device, each of the light-emitting elements is bijectively assigned to one of the first connection locations and electrically connected to said assigned first connection location via one of said first connections which is bijectively assigned to said first connection location and to the light-emitting element. In this way the number of the light-emitting elements is the same as the number of the first connection locations and the same as the number of the first connections. Thus, each first connection location forms an individual anode or an individual cathode for one of the light-emitting elements. In this way, the light-emitting elements can be operated independently from each other.

According to one aspect, all of the light-emitting elements are assigned to the second connection locations and electrically connected to said second connection locations via the second connection. In this way the second connection locations form a common cathode or a common anode for all light-emitting elements of the light-emitting device.

According to one aspect of the light-emitting device, the light-emitting device is free of any bonding wire. This is possible due to the use of the first and second connections, which run along or through components of the light-emitting device. The elimination of bonding wires allows for a mechanically more stable device as there is no mechanical stress on the bonding wires. Thus, the device has an improved reliability performance in comparison with a device comprising bonding wires. Further, as there is no need for bonding wires, the required space for these wires is saved and thus the device has a higher package density than comparable devices with bonding wires.

According to one aspect of the light-emitting device, at least one of the following components of the light-emitting device is reflective for light emitted by the light-emitting elements: the encapsulation, the second connection. For example, the encapsulation comprises a matrix material such as, for example, silicone or epoxy resin into which light scattering and/or light reflecting particles like, for example, particles of $TiO_2$ are embedded. The second connection can be formed, for example, by a reflecting metal and thus build an optical separation between adjacent semiconductor chips.

Further it is possible that the encapsulation is light-absorbing. For this purpose the encapsulation can, for example, be filled with color pigments or carbon black particles.

Further, a method for producing a plurality of light-emitting devices is specified. By means of this method, inter alia the here described light-emitting devices can be produced.

Therefore all features disclosed for the light-emitting devices are also disclosed for the method and vice versa.

According to one aspect of the method, the method comprises a method step in which a carrier is provided. The carrier is, or can be, separated in a later stage into a plurality of here described supports.

According to one aspect of the method, the method comprises a method step wherein a plurality of connection points are provided and a plurality of second connection locations are provided at a bottom side of the carrier. The connection points are, or can be, separated in a later method step into here described first connection locations. For example, the connection points and the connection locations are given by metallizations of the carrier at the bottom side of the carrier.

According to one aspect of the method, a plurality of light-emitting elements is provided at a top side of the carrier. Thereby at least two light-emitting elements per support are provided at the top side. The light-emitting elements are, for example, glued or soldered to the carrier.

According to one aspect of the method, the method comprises a method step in which first recesses are formed between some of the light-emitting elements by separating the carrier into a plurality of supports and by separating each connection point into at least two first connection locations. The separation can, for example, be done by sawing, cutting or laser processing, like laser cutting.

According to one aspect of the method, the method comprises a method step in which the first recesses are filled with a first connection material. The first connection material is, for example, given by a copper plating.

According to one aspect, the method comprises a method step in which the first connection material is separated along the filled first recesses into first connections. The separation is, for example, performed by sawing through the first connection material. In this way the here described first connections can be finished.

According to one aspect of the method for producing a plurality of light-emitting devices, the method comprises the following steps:
  providing a carrier
  providing a plurality of connection points and a plurality of second connection locations at a bottom side of the carrier,
  providing a plurality of light-emitting elements at a top side of the carrier,
  forming first recesses between some of the light-emitting elements by separating the carrier into a plurality of supports and by separating each connection point into at least two first connection locations,
  filling the first recesses with a first connection material,
  separating the first connection material along the filled first recesses into first connections.

It is possible that the steps are performed in the order specified here. Further, it is possible that the sequence of some of the method steps can be changed.

According to one aspect of the method, the method comprises a further method step in which each light-emitting element is partly enclosed by an encapsulation. This method step can, for example, be performed after providing a plurality of light-emitting elements at a top side of the carrier and before the first recesses are formed. The light-emitting elements are surrounded by the encapsulation, for example by film-assisted molding.

According to one aspect of the method, second recesses are formed through the encapsulation and the second recesses are filled with a second connection. For example, the second recesses are filled in the same method step as the first recesses. For example, the second recesses can be formed by the same copper plating as the first recesses.

According to one method step, the second recesses are not only formed through the encapsulation but also through the carrier. Alternatively it is possible that the carrier already has recesses and the second recesses are formed in the encapsulation in such a way that they coalesce with the recesses in the carrier.

In the following advantageous embodiments and developments of the here described devices and the here described methods will become apparent from the exemplary embodiments described below in association with the figures.

Figure 1B:
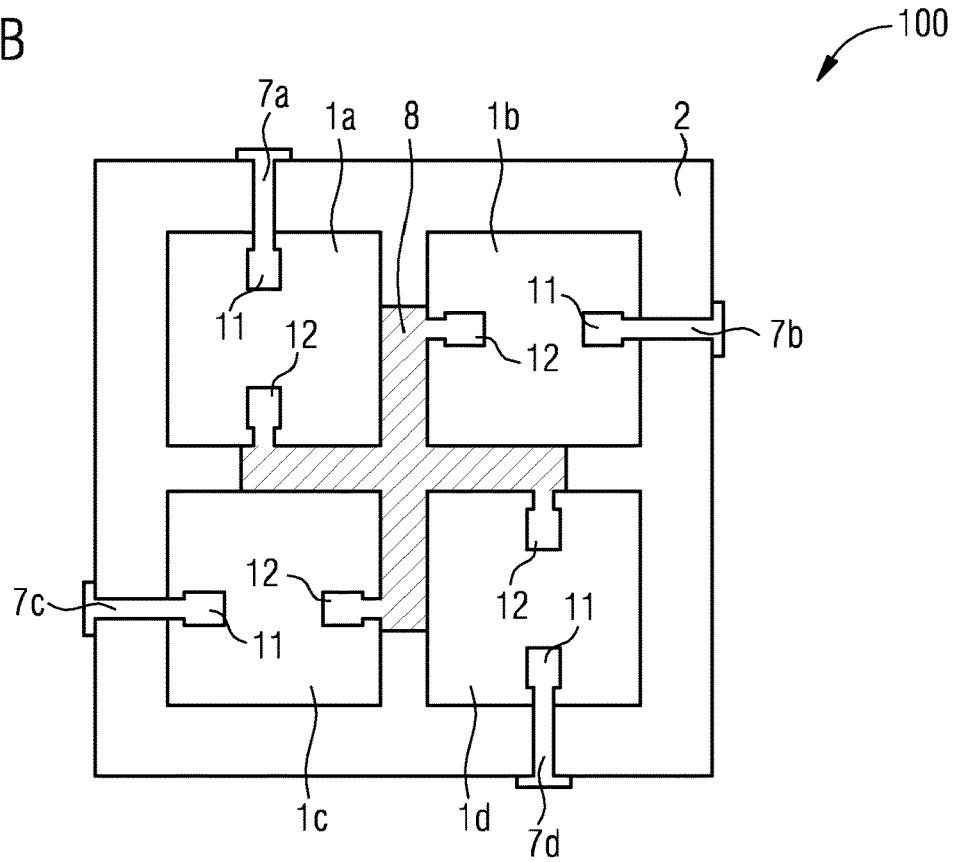
Figure 1C:
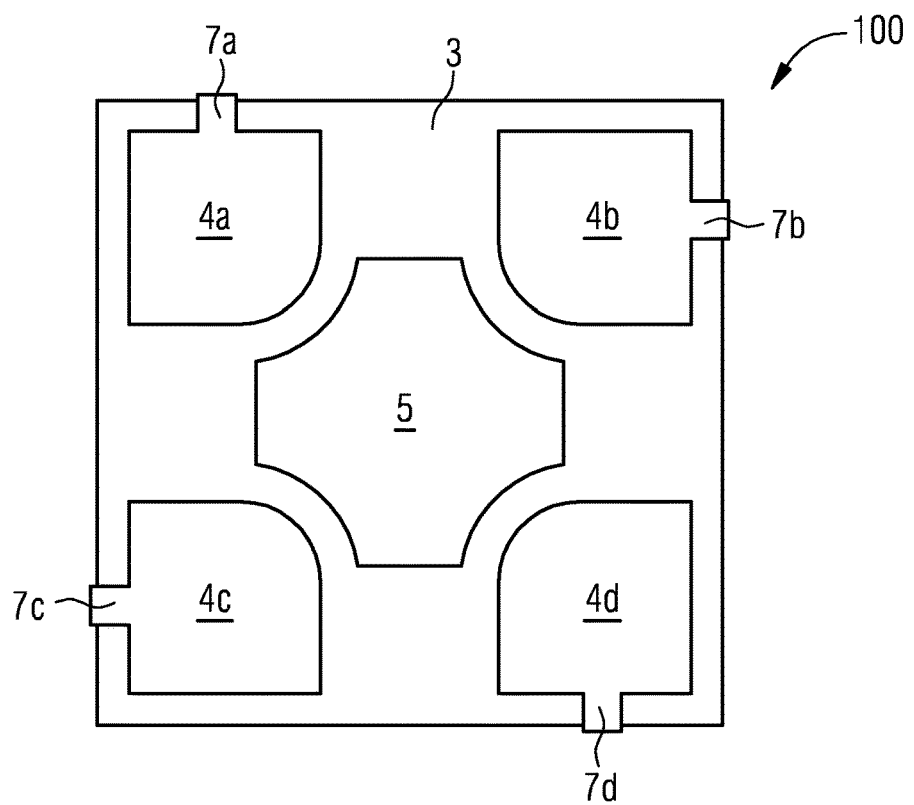
Figure 2A:
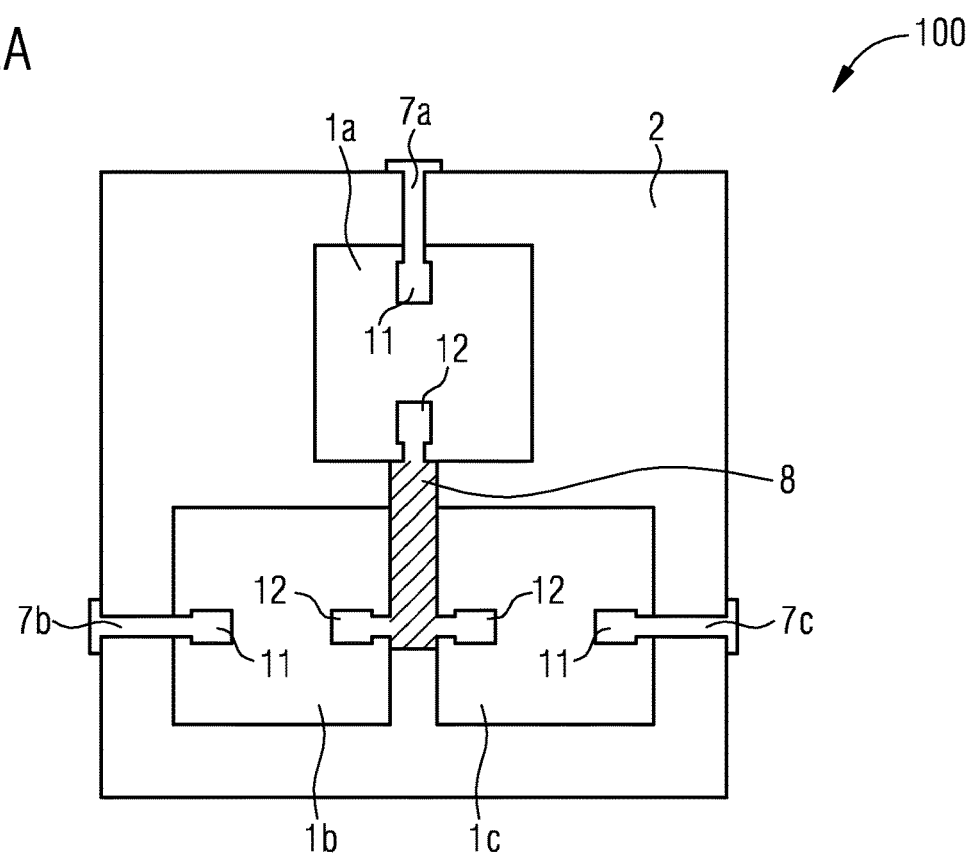
Figure 2B:
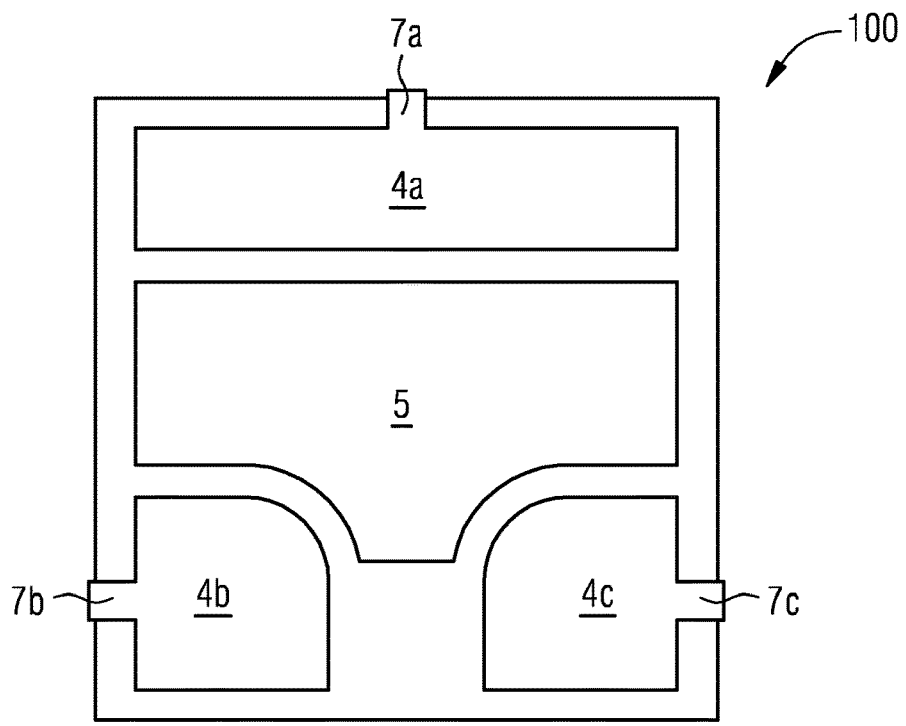

In the figures:

FIG. 1A shows a schematic cross-sectional view of an embodiment of a here described device, FIG. 1B shows a schematic plan view of the top side of an embodiment of a here described device, FIG. 1C shows a schematic top view of the bottom side of an embodiment of a here described device, FIG. 2A shows a schematic plan view of a top side of a further embodiment of a here described device, FIG. 2B shows the associated plan view of the bottom side of the same device; and FIGS. 3A, 3B, 3C, 3D, 3E, 3F, 3G, 3H show schematic cross-sectional views for method steps of an embodiment of a here described method for producing a plurality of light-emitting devices.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

FIG. 1A shows a schematic sectional view of an embodiment of a here described device. FIG. 1B shows the related top view of a top side of the embodiment, and FIG. 1C shows the schematic plan view of the bottom side of the embodiment.

The light-emitting device comprises four light-emitting elements $1a$, $1b$, $1c$, $1d$. Each light-emitting element $1a$, $1b$, $1c$, $1d$ is given by a light-emitting diode chip. Each light-emitting element $1a$, $1b$, $1c$, $1d$ emits light during operation, wherein different light-emitting elements can emit light of different colors and/or of different color temperatures.

The light-emitting elements $1a$, $1b$, $1c$, $1d$ are arranged on a common support 3 which forms a substrate for the light-emitting elements $1a$, $1b$, $1c$, $1d$. The support is a ceramic material, a PCB or a premolded leadframe. Further, it is possible that the support 3 comprises a metal core which is surrounded by electrically insulating material.

The light-emitting elements $1a$, $1b$, $1c$, $1d$ are, for example, fastened to the support 3 by the use of an adhesive or solder material.

The light-emitting elements $1a$, $1b$, $1c$, $1d$ are enclosed by an encapsulation 2 which surrounds the light-emitting elements $1a$, $1b$, $1c$, $1d$ on their side surfaces and, for example, is flush with the surface of the light-emitting elements facing away from the support 3.

Each light-emitting element $1a$, $1b$, $1c$, $1d$ comprises a first contact location 11 and a second contact location 12.

At the bottom side of the support 3 first connection locations $4a$, $4b$, $4c$, $4d$ and a single second connection location 5 are arranged.

The first contact location 11 of each light-emitting element $1a$, $1b$, $1c$, $1d$ is connected to an associated first connection location $4a$, $4b$, $4c$, $4d$ via corresponding first connections $7a$, $7b$, $7c$, $7d$ which run along a side surface of the encapsulation and the support 3. Thus, the package sidewall is used for wiring the light-emitting elements 1a, 1b, 1c, 1d. This is surprisingly and advantageously space-saving.

Further, a single second connection 8 runs through the encapsulation 2 and through the support 3 and connects the second contact locations 12 of all chips with the common second connection location. The second connection 8 and the encapsulation 2 form a via contact 9.

For example, the first connection locations 4a, 4b, 4c, 4d form individual anodes for the light-emitting elements 1a, 1b, 1c, 1d, and the second connection location 5 forms a common cathode for all light-emitting elements 1a, 1b, 1c, 1d.

The light-emitting device further comprises a cover 13 which is, for example, given by a clear epoxy or silicone material and which forms a protective layer or lens for the light-emitting elements. For example, the cover 13 can also be formed in a convex manner over each light-emitting element, thus enhancing the probability for light extraction out of the device. Further, the cover 13 can comprises radiation scattering or radiation converting particles like, for instance, phosphor particles.

FIG. 2A shows a schematic plan view of a top side of a further embodiment of a here described device, FIG. 2B shows the associated plan view of the bottom side of the same device.

In contrast to the embodiment described in connection with FIGS. 1A, 1B and 1C, the device of this embodiment has three instead of four light-emitting elements 1a, 1b, 1c.

The light-emitting device comprises three light-emitting elements 1a, 1b, 1c. Each light-emitting element 1a, 1b, 1c is given by a light-emitting diode chip. Each light-emitting element 1a, 1b, 1c emits light during operation, wherein different light-emitting elements can emit light of different colors and/or of different color temperatures.

The light-emitting elements 1a, 1b, 1c are arranged on a common support 3 which is, for example, formed with an electrically insulating material like a ceramic material or a plastic material. Further, it is possible that the support 3 comprises a metal core which is surrounded by electrically insulating material.

The light-emitting elements 1a, 1b, 1c can be fastened to the support 3 by the use of an adhesive or solder material.

The light-emitting elements 1a, 1b, 1c are enclosed by an encapsulation 2 which surrounds the light-emitting elements 1a, 1b, 1c on their side surfaces and, for example, is flush with the surface of the light-emitting elements facing away from the support 3.

Each light-emitting element 1a, 1b, 1c comprises a first contact location 11 and a second contact location 12.

At the bottom side of the support 3 first connection locations 4a, 4b, 4c and a single second connection location 5 are arranged.

The first contact location 11 of each light-emitting element 1a, 1b, 1c is connected to an associated first connection location 4a, 4b, 4c via corresponding first connections 7a, 7b, 7c. Each first connection 7a, 7b, 7c runs along a side surface of the encapsulation and the support 3. Thus, the package sidewall is used for wiring the light-emitting elements 1a, 1b, 1c, which is advantageously space-saving.

Further, a single second connection 8 runs through the encapsulation 2 and through the support 3 and connects the second contact locations 12 of all chips with the common second connection location 5. The second connection 8 and the encapsulation 2 form a via contact 9.

For example, the first connection locations 4a, 4b, 4c form individual anodes for the light-emitting elements 1a, 1b, 1c, and the second connection location 5 forms a common cathode for all light-emitting elements 1a, 1b, 1c.

The light-emitting device further comprises a cover 13 which is, for example, given by a clear epoxy or silicone material and which forms a protective layer or lens for the light-emitting elements. For example, the cover 13 can also be formed in a convex manner over each light-emitting element, thus enhancing the probability for light extraction out of the device. Further, the cover 13 can comprises radiation scattering or radiation converting particles like, for instance, phosphor particles. The cover 13 is optional for all embodiments.

In connection with the schematic cross-sectional views of FIGS. 3A, 3B, 3C, 3D, 3E, 3F, 3G, 3H an embodiment of a here described method for producing a plurality of light-emitting devices is described in detail.

Figure 3A:
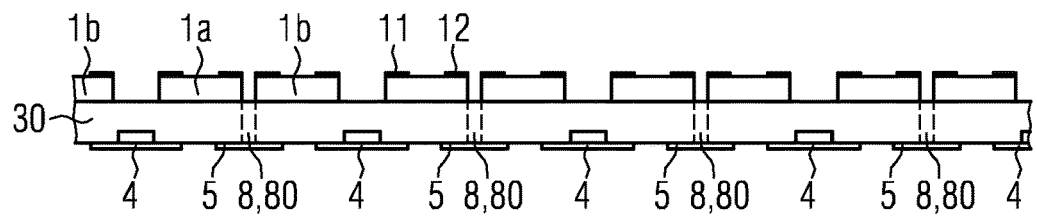

In a first method step, FIG. 3A, a carrier 30, which later results in a plurality of supports 3, is provided. A plurality of light-emitting elements 1a, 1b, 1c, 1d is attached to a top side of the carrier 30. The light-emitting elements 1a, 1b, 1c, 1d are, for example, so-called flip-chips with first 11 and second 12 contact locations at their top side.

Further, connection points 40 and second connection locations 5 are provided at the bottom side of the carrier 30. Here it is possible that the second connections 8 or the second recesses 80 are already provided in the carrier 30. That is to say, the carrier can comprise a few vias or plated through holes (PTH) in between chip bond pads.

Further, it is possible that these elements are produced in a later method step described in connection with FIG. 3D.

Figure 3B:
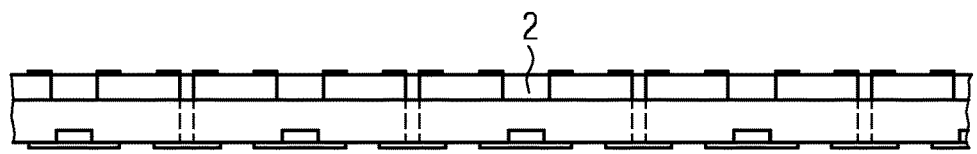

In the next method step, FIG. 3B, the light-emitting elements 1a, 1b, 1c, 1d are surrounded by the encapsulation 2, for example by film-assisted molding.

Figure 3C:
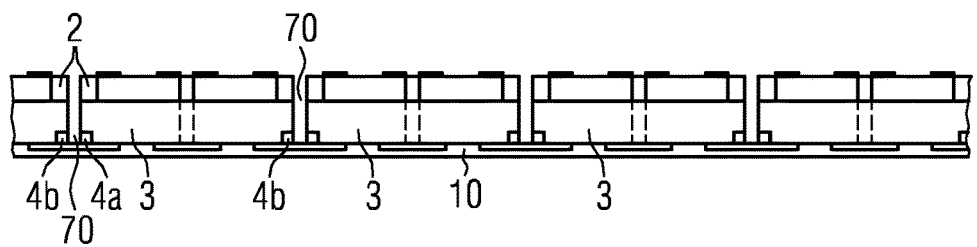

In the next method step, FIG. 3C, first recesses 70 are formed through the encapsulation 2, the carrier 30 and the connection points, thus forming individual supports 3 and individual first connection locations 4a, 4b, 4c, 4d.

Figure 3D:
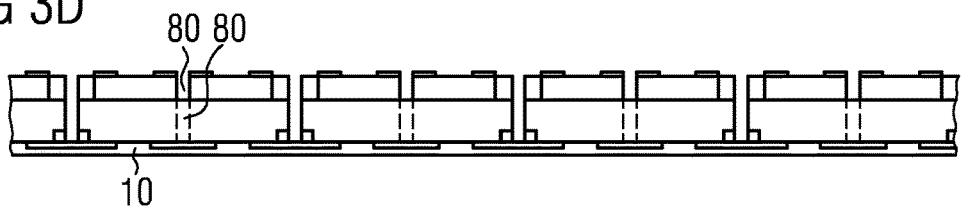
Figure 3E:
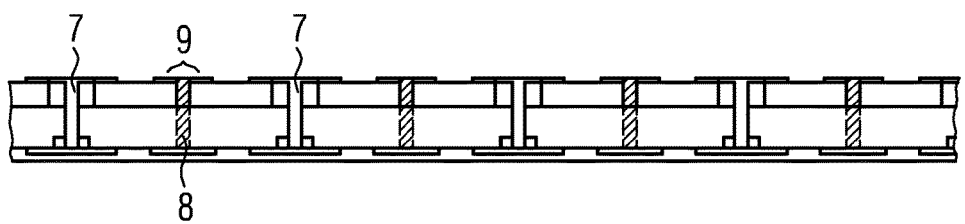

In the next method step, FIG. 3D, second recesses 80 are formed at least in the encapsulation 2. If not already present, the second recesses 80 are also formed in the carrier 30, thus reaching from the top side of the carrier 30 through the carrier 30 to the second contact locations 5. The second recesses can, for example, be formed by applying laser radiation to the clearance in between light-emitting elements or by sawing.

In a next method step first connection material 7 and second connection 8 are formed, for example by copper plating and patterning using a photoresist, lithography and development.

Figure 3F:
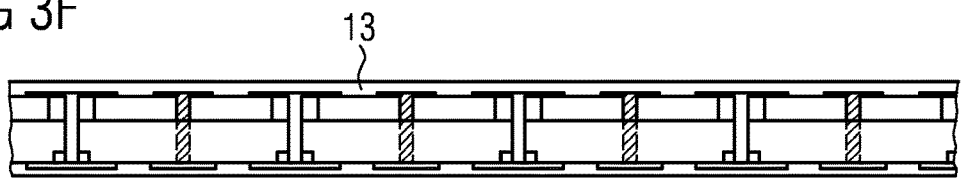

In the optional method step of FIG. 3F a cover 13, for example a layer of clear epoxy or silicone, is formed over all light-emitting elements 1a, 1b, 1c, 1d.

Figure 3G:
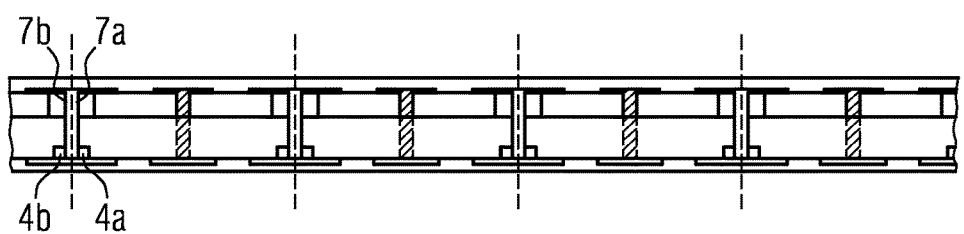

In the method step of FIG. 3G, sawing into individual devices is performed through the first connection material 7, thus resulting in first connections 7a, 7b, 7c and 7d. For example the first connections thus show traces of the separation at their outer surface which faces away from the support 3.

Figure 3H:
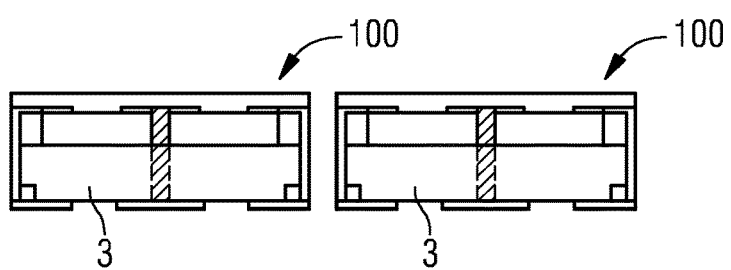

FIG. 3H shows the produced light-emitting devices 100, which are, for example, described in detail in connection with FIGS. 1A, 1B, and 1C.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

LIST OF REFERENCE SINGS 1a light-emitting element
1b light-emitting element
1c light-emitting element
1d light-emitting element
11 first contact location
12 second contact location
2 encapsulation
3 support
30 carrier
4a first connection location
4b first connection location
4c first connection location
4d first connection location
40 connection points
5 second connection location
7 first connection material
7a first connection
7b first connection
7c first connection
7d first connection
70 first recess
8 second connection
80 second recess
9 via contact
10 auxiliary support
13 cover
100 light-emitting device

The invention claimed is:

1. Light-emitting device comprising:
   a support,
   at least two light-emitting elements at a top side of the support,
   first connection locations and a single second connection location at a bottom side of the support, wherein
   each light-emitting element comprises a first contact location and a second contact location at a side facing away from the support,
   each first contact location is connected to one of the first connection locations via a first connection,
   all of the second contact locations are connected to the second connection location via a second connection,
   the first connections run along an outer surface of the support, and
   the second connection runs through the support.

2. Light-emitting device according to claim 1, wherein
   the light-emitting elements are partly enclosed by an encapsulation, and
   the first connections run along an outer surface of the encapsulation.

3. Light-emitting device according to claim 1, wherein parts of the second connection are arranged between adjacent light-emitting elements.

4. Light-emitting device according to claim 1, wherein each of the light-emitting elements is bijectively assigned to one of the first connection locations and electrically connected to said assigned first connection location via one of said first connections which is bijectively assigned to said first connection location and to the light-emitting element.

5. Light-emitting device according to claim 1, wherein all of the light-emitting elements are assigned to the second connection location fat and electrically connected to said second connection location fat via the second connection.

6. Light-emitting device according to claim 1, which is free of any bonding wire.

7. Light-emitting device according to claim 1, wherein at least one of the following components is reflective for light emitted by the light-emitting elements: the encapsulation, the second connection.

8. Light-emitting device according to claim 1, wherein
   the light-emitting elements are partly enclosed by an encapsulation, and
   the second connection runs through the encapsulation.

9. Light-emitting device according to claim 8, wherein the second connection and the encapsulation form a via contact.

10. Method for producing a plurality of light-emitting devices according to claim 1 with the following method steps:
    providing a carrier
    providing a plurality of connection points and a plurality of second connection locations at a bottom side of the carrier,
    providing a plurality of light-emitting elements at a top side of the carrier,
    forming first recesses between some of the light-emitting elements by separating the carrier into a plurality of supports and by separating each connection point into at least two first connection locations,
    filling the first recesses with a first connection material,
    separating the first connection material along the filled first recesses into first connections.

11. Method according to claim 10, wherein each light-emitting element is partly enclosed by an encapsulation.

12. Method according to claim 11, wherein
    second recesses are formed through the encapsulation,
    the second recesses are filed with a second connection.

13. Method according to claim 12, wherein the second recesses are formed through the carrier.

* * * * *